(12) United States Patent
Shimono

(10) Patent No.: US 10,847,707 B2
(45) Date of Patent: Nov. 24, 2020

(54) ELASTIC WAVE DEVICE

(71) Applicant: Murata Manufacturing Co., Ltd., Nagaokakyo (JP)

(72) Inventor: Osamu Shimono, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 322 days.

(21) Appl. No.: 15/698,877

(22) Filed: Sep. 8, 2017

(65) Prior Publication Data
US 2018/0182950 A1 Jun. 28, 2018

(30) Foreign Application Priority Data

Dec. 28, 2016 (JP) .................................. 2016-256463

(51) Int. Cl.
| | |
|---|---|
| *H01L 41/053* | (2006.01) |
| *H03H 9/145* | (2006.01) |
| *H03H 3/08* | (2006.01) |
| *H01L 41/29* | (2013.01) |
| *H03H 9/25* | (2006.01) |

(Continued)

(52) U.S. Cl.
CPC .......... *H01L 41/0533* (2013.01); *H01L 41/29* (2013.01); *H03H 3/08* (2013.01); *H03H 9/02818* (2013.01); *H03H 9/14541* (2013.01); *H03H 9/25* (2013.01); *H01L 41/0477* (2013.01)

(58) Field of Classification Search
CPC .............. H01L 41/05333; H01L 41/29; H03H 9/02818; H03H 9/25; H03H 9/14541; H03H 3/08
See application file for complete search history.

(56) References Cited

U.S. PATENT DOCUMENTS 5,986,524 A * 11/1999 Shimoe ................ H03H 9/6436
333/195
6,237,414 B1 * 5/2001 Yukawa ............. G01C 19/5698
73/504.01

(Continued)

FOREIGN PATENT DOCUMENTS

JP 2011-041134 A 2/2011

OTHER PUBLICATIONS

English Translation of JP 2011041134 (Year: 2011).*

*Primary Examiner* — Bryan P Gordon
(74) *Attorney, Agent, or Firm* — Keating & Bennett, LLP

(57) ABSTRACT

An elastic wave device includes, when a region of a main surface of a piezoelectric substrate in which a first functional electrode including a comb-shaped or substantially comb-shaped electrode and reflectors and a second functional electrode including a comb-shaped or substantially comb-shaped electrode and reflectors are provided is referred to as a first region, and the remaining region of the main surface is referred to as a second region, first metal members provided in the second region so as to be adjacent to the first functional electrode and second metal members provided in the second region so as to be adjacent to the second functional electrode. The first and second metal members are not electrically connected to any of the functional electrodes. A dielectric film is provided on the main surface of the piezoelectric substrate so as to cover the functional electrodes and the first and second metal members.

9 Claims, 6 Drawing Sheets

(51) Int. Cl.
*H03H 9/02* (2006.01)
*H01L 41/047* (2006.01)

(56) References Cited

U.S. PATENT DOCUMENTS

| | | | |
|---|---|---|---|
| 2004/0046482 A1* | 3/2004 | Furukawa | H03H 9/02921 310/313 D |
| 2011/0133600 A1* | 6/2011 | Kimura | H03H 9/14541 310/313 B |
| 2011/0193655 A1* | 8/2011 | Kamiguchi | H03H 9/14517 333/186 |
| 2014/0285287 A1* | 9/2014 | Komatsu | H03H 9/25 333/195 |
| 2016/0182007 A1* | 6/2016 | Bhattacharjee | H03H 3/02 310/313 D |

\* cited by examiner

ELASTIC WAVE DEVICE

CROSS REFERENCE TO RELATED APPLICATIONS

This application claims the benefit of priority to Japanese Patent Application No. 2016-256463 filed on Dec. 28, 2016. The entire contents of this application are hereby incorporated herein by reference.

BACKGROUND OF THE INVENTION

1. Field of the Invention

The present invention relates to an elastic wave device that includes a piezoelectric substrate, a functional electrode provided on a main surface of the piezoelectric substrate, the functional electrode including a substantially comb-shaped electrode and reflectors, and a dielectric film provided on the main surface of the piezoelectric substrate so as to cover the functional electrode.

2. Description of the Related Art

An elastic wave device described in Japanese Unexamined Patent Application Publication No. 2011-41134 is an example of an elastic wave device that has a structure related to preferred embodiments of the present invention. FIG. 6A and FIG. 6B are schematic diagrams each illustrating an elastic wave device 300 described in Japanese Unexamined Patent Application Publication No. 2011-41134. FIG. 6A is a plan view (top view) of the elastic wave device 300. FIG. 6B is a sectional view of the elastic wave device 300 taken along line C-C of FIG. 6A.

The elastic wave device 300 described in Japanese Unexamined Patent Application Publication No. 2011-41134 includes a piezoelectric substrate 301, a functional electrode Fa, a dielectric film 312, and stopper layers 313. The functional electrode Fa includes a comb-shaped or substantially comb-shaped electrode 302 and reflectors 303 and 304 and is provided on a main surface of the piezoelectric substrate 301. The dielectric film 312 is provided on the main surface of the piezoelectric substrate 301 so as to cover the functional electrode Fa. Each of the stopper layers 313 includes at least a metal layer provided in a lower portion thereof, and the uppermost surface of the stopper layer 313 is made of a material having a lower polishing rate than the dielectric film 312.

The elastic wave device 300 is manufactured by the following method. First, the functional electrode Fa and the stopper layers 313 are formed on the main surface of the piezoelectric substrate 301. Next, the dielectric film 312 is formed so as to cover the functional electrode Fa and the stopper layers 313. After that, the dielectric film 312 is ground by, for example, a chemical mechanical polishing (CMP) method until the grinding reaches the stopper layers 313. The elastic wave device 300 described in Japanese Unexamined Patent Application Publication No. 2011-41134 has the above-described characteristics and is manufactured by the above-described method, and thus, the possibility of irregularities being formed on the outer surface of the dielectric film 312 is suppressed.

In the elastic wave device 300 described in Japanese Unexamined Patent Application Publication No. 2011-41134, the presence of the stopper layers 313 is considered to reduce the possibility of a step portion consisting of the dielectric film 312 being formed in the peripheral edge portion of the piezoelectric substrate 301. When the dielectric film 312 is ground by the CMP method until the grinding reaches the uppermost surfaces of the stopper layers 313, a phenomenon known as dishing, in which the dielectric film 312 is ground to a depth deeper than a depth corresponding to the positions of the uppermost surfaces of the stopper layers 313, occurs. In other words, in practice, the outer surface of the dielectric film 312 is not flat as illustrated in FIG. 6B but has a slightly recessed dish-like shape.

Grinding using the CMP method is performed in a state where a load is applied to a wafer. In this case, there is a possibility that, in each of a large number of elastic wave devices 300 obtained by singulating the wafer, dishing of the dielectric film 312 occurs, that is, variations in irregularities formed on the outer surface of the dielectric film 312 occur depending on the manner in which the load is applied to the wafer. As a result, there is a possibility of variations occurring in electrical characteristics of the elastic wave device 300.

SUMMARY OF THE INVENTION

Preferred embodiments of the present invention provide elastic wave devices in which irregularities formed on the outer surface of a dielectric film are reduced or prevented, and the possibility of variations occurring in electrical characteristics thereof is reduced or prevented.

An elastic wave device according to a preferred embodiment of the present invention includes a piezoelectric substrate, a functional electrode that includes a comb-shaped or substantially comb-shaped electrode and that is provided on a main surface of the piezoelectric substrate, and a dielectric film. Here, a region of the main surface of the piezoelectric substrate in which the functional electrode is provided is referred to as a first region, and a region of the main surface of the piezoelectric substrate excluding the first region is referred to as a second region. The elastic wave device according to this preferred embodiment of the present invention further includes a metal member that is provided in the second region so as to be adjacent to the functional electrode and is not electrically connected to the functional electrode. The dielectric film is provided on the main surface of the piezoelectric substrate so as to cover the functional electrode and the metal member together. Note that the functional electrode may preferably further include a reflector.

In the above-described elastic wave device, the metal member is disposed in a region in which the functional electrode is not provided. Thus, the possibility of a step portion including the dielectric film being formed between the region in which the functional electrode is provided and the region in which the functional electrode is not provided is reduced or prevented. Unlike the elastic wave device described in Japanese Unexamined Patent Application Publication No. 2011-41134, grinding using the CMP method is performed only on the dielectric film. Consequently, dishing does not occur in the dielectric film. Therefore, in each of a large number of elastic wave devices obtained by singulating a wafer, variations in irregularities on the outer surface of the dielectric film are reduced. As a result, the possibility of variations occurring in electrical characteristics of the elastic wave device is reduced or prevented.

It is preferable that an elastic wave device according to a preferred embodiment of the present invention have the following characteristics. That is to say, the metal member is preferably made of the same metal material as the functional electrode.

In the above-described elastic wave device, the metal member and the functional electrode are able to be formed in the same process. As a result, a process of manufacturing the elastic wave device is simplified.

It is preferable that an elastic wave device according to a preferred embodiment of the present invention have the following characteristics. That is to say, the metal member preferably has a comb shape or substantially comb shape.

In the above-described elastic wave device, the metal member and the functional electrode preferably have a similar shape. Thus, for example, when forming the dielectric film by bias sputtering, a dielectric material is deposited onto the first region and onto the second region in a similar manner. In other words, the dielectric film grows on the first region and on the second region in the same or similar manner. Therefore, in each of a large number of elastic wave devices obtained by singulating a wafer, variations in irregularities on the outer surface of the dielectric film are further reduced. As a result, the possibility of variations occurring in the electrical characteristics of the elastic wave device is further reduced.

It is preferable that an elastic wave device according to a preferred embodiment of the present invention have the following characteristics. That is to say, the metal member and the functional electrode preferably have the same or substantially the same thickness in a direction perpendicular or substantially perpendicular to the main surface of the piezoelectric substrate.

Here, the thickness of the metal member is able to be defined by measuring, at a plurality of positions in a cross-sectional observation photograph taken by using a scanning electron microscope (SEM), the distance between the piezoelectric substrate and the outer surface of the metal member in the direction perpendicular or substantially perpendicular to the main surface of the piezoelectric substrate and by averaging the measured values. The thickness of the functional electrode is defined in a manner similar to the manner described above. In the case where the metal member and the functional electrode are made of the same metal material, the thickness of the metal member and the thickness of the functional electrode may each be defined by a value measured by, for example, an X-ray reflectivity technique described in The Rigaku Journal, Vol. 40, No. 2 (2009), pp. 1-9.

The phrase "the metal member and the functional electrode have the same thickness" implies that variations in the thickness of the metal member and variations in the thickness of the functional electrode that occur during manufacturing processes are included.

In the above-described elastic wave device, the metal member and the functional electrode preferably have the same or substantially the same thickness. Consequently, the dielectric film grows on the first region and on the second region in the same or similar manner. Therefore, in each of a large number of elastic wave devices obtained by singulating a wafer, variations in irregularities on the outer surface of the dielectric film are further reduced. As a result, the possibility of variations occurring in the electrical characteristics of the elastic wave device is further reduced.

In elastic wave devices according to various preferred embodiments of the present invention, variations in irregularities on the outer surface of a dielectric film are reduced or prevented, and the possibility of variations occurring in electrical characteristics of the elastic wave device is reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below. Although a surface acoustic wave (SAW) filter is described as an example of an elastic wave device to which preferred embodiments of the present invention are applied, the present invention is not limited to such a SAW filter.

The structure of an elastic wave device 100 according to a preferred embodiment of the present invention and the structures of elastic wave devices according to modifications of the elastic wave device 100 will now be described with reference to FIG. 1A to FIG. 3. Note that FIG. 1A to FIG. 3 illustrate principal portions only, and descriptions and illustrations of the other portions will be omitted for simplification. Likewise, the remaining drawings illustrate principal portions only.

Each drawing is a schematic diagram and does not necessarily reflect the actual dimensions of the devices. In addition, the drawings do not necessarily reflect variations in the shapes of components that occur during manufacturing processes. In other words, in the present specification, the drawings that will be referred to in the following description essentially illustrate the actual devices even if illustrating portions different from those of the actual devices.

Figure 1A:
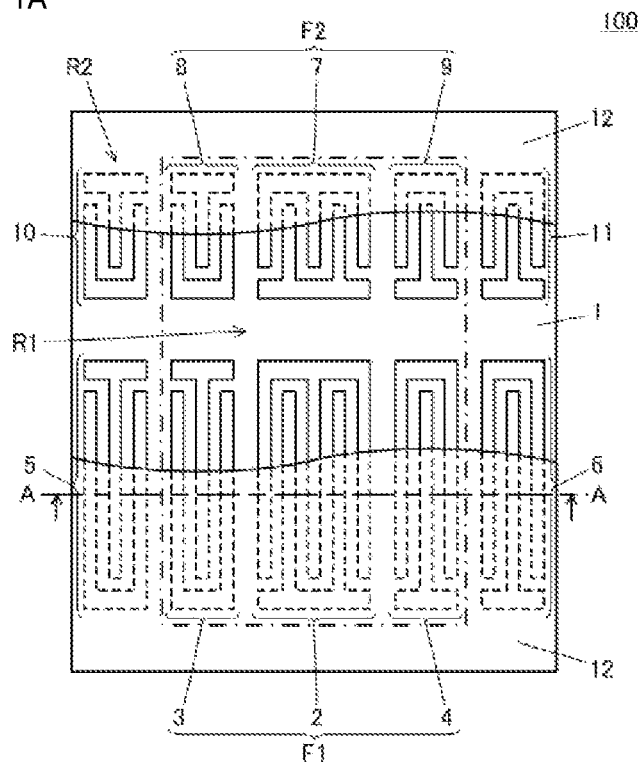
FIGS. 1A and 1B are respectively a plan view (top view) illustrating an elastic wave device according to a preferred embodiment of the present invention without illustrating a portion of a dielectric film, and a sectional view of the elastic wave device taken along line A-A of FIG. 1A.
Figure 1B:
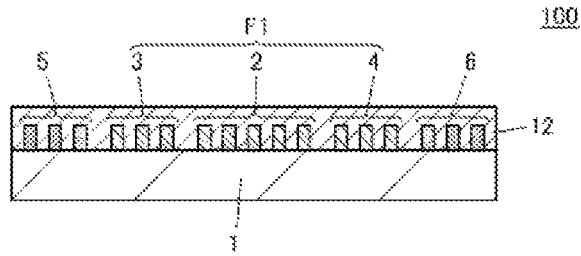
Figure 2:
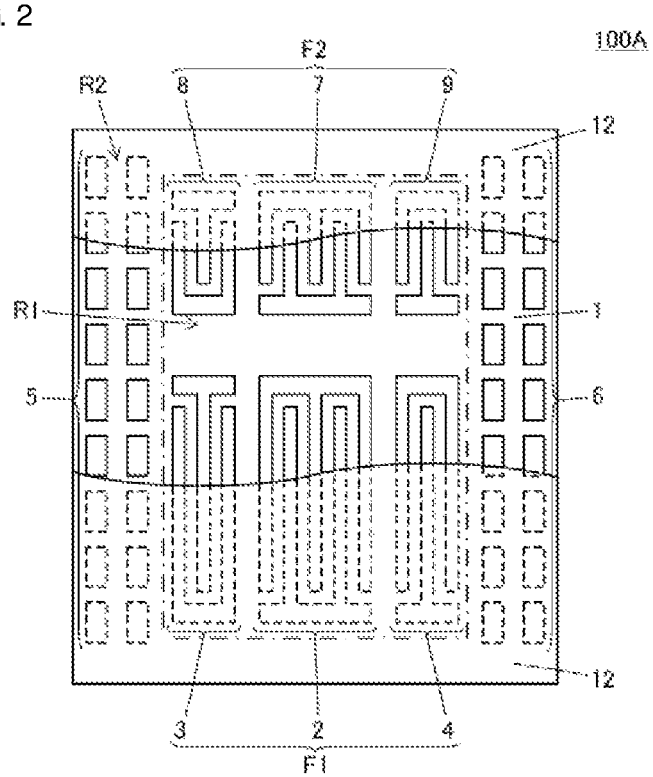
FIG. 2 is a plan view (top view) illustrating an elastic wave device according to a first modification of an elastic wave device according to a preferred embodiment of the present invention without illustrating a portion of a dielectric film.
Figure 3:
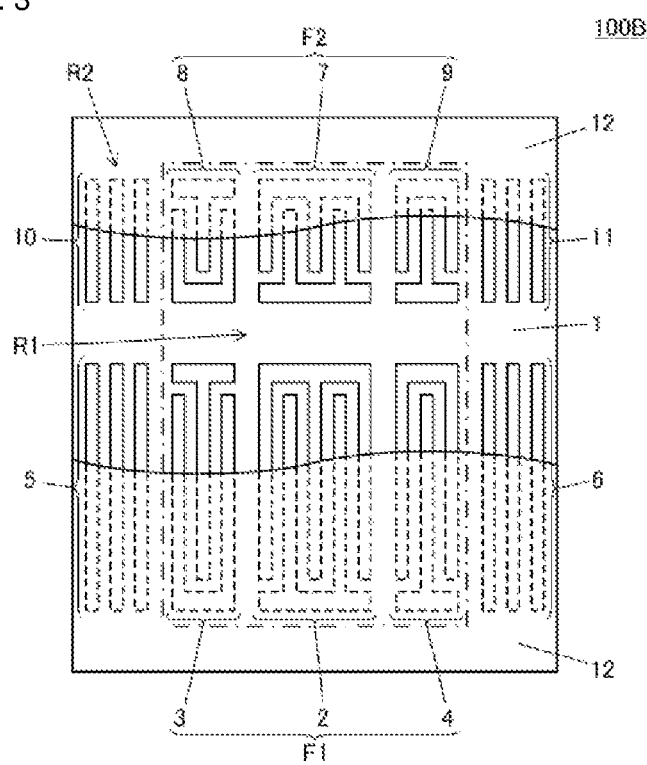
FIG. 3 is a plan view (top view) illustrating an elastic wave device according to a second modification of an elastic wave device according to a preferred embodiment of the present invention without illustrating a portion of a dielectric film.

FIG. 1A to FIG. 2 are schematic diagrams each illustrating the elastic wave device 100. FIG. 1A is a plan view (top view) illustrating the elastic wave device 100 without illustrating a portion of a dielectric film 12, which will be described later. FIG. 1B is a sectional view taken along line A-A of FIG. 1A. Each of FIG. 1A and FIG. 2 illustrates a principal portion of the elastic wave device 100 only, and illustrations of other components are omitted.

The elastic wave device 100 includes a piezoelectric substrate 1, a functional electrode F1 that includes a comb-shaped or substantially comb-shaped electrode 2 and reflectors 3 and 4, a functional electrode F2 that includes a comb-shaped or substantially comb-shaped electrode 7 and reflectors 8 and 9, and the dielectric film 12. The piezoelectric substrate 1 may be made of, for example, a piezoelectric material, such as $LiTaO_3$ and $LiNbO_3$. The comb-shaped or substantially comb-shaped electrode 2 is an interdigital transducer (IDT) electrode. The functional electrode F1 and the functional electrode F2 are made of a material that will be described later and provided on a main surface of the piezoelectric substrate 1. Note that the number of the functional electrodes is not limited to the above. In addition, each of the functional electrodes F1 and F2 does not need to include reflectors.

A region of the main surface of the piezoelectric substrate 1 in which the functional electrode F1 and the functional electrode F2 are provided will be referred to as a first region R1, and the remaining region of the main surface of the piezoelectric substrate 1 will be referred to as a second region R2. The elastic wave device 100 further includes metal members 5 and 6 that are provided in the second region R2 so as to be adjacent to the functional electrode F1 and metal members 10 and 11 that are provided in the second region R2 so as to be adjacent to the functional electrode F2. In the elastic wave device 100, the metal members 5 and 6 are disposed with the functional electrode F1 interposed therebetween in an elastic wave propagation direction. Similarly, the metal members 10 and 11 are disposed with the functional electrode F2 interposed therebetween in the elastic wave propagation direction.

In the elastic wave device 100, the metal members 5, 6, 10, and 11 each preferably have a comb shape or a substantially comb shape. The comb-shaped or substantially comb-shaped electrodes 2 and 7 and the reflectors 3, 4, 8, and 9, which are included in the functional electrodes F1 and F2, preferably have the same or substantially the same thickness in a direction perpendicular or substantially perpendicular to the main surface of the piezoelectric substrate 1. The definition of the thickness of each of the above-mentioned components and the definition of having the same thickness are as described above. In this case, in a process of manufacturing the elastic wave device 100, the dielectric film 12 grows on the above-mentioned first region R1 and on the above-mentioned second region R2 in the same or similar manner. Thus, variations in irregularities on the outer surface of the dielectric film 12, which will be described later, are effectively reduced.

The metal members 5, 6, 10, and 11 reduce the difference between the manner in which the dielectric film 12 is formed on the first region R1 and the manner in which the dielectric film 12 is formed on the second region R2 as a result of being disposed in the second region R2. In preferred embodiments of the present invention, components that exhibit the above-mentioned advantageous effects are referred to as metal members.

In the elastic wave device 100, the functional electrodes F1 and F2 and the metal members 5, 6, 10, and 11 are preferably made of the same metal material such as, for example, Cu or Al. In this case, as will be described later, the functional electrodes F1 and F2 and the metal members 5, 6, 10, and 11 are able to be formed in the same process. However, the functional electrodes F1 and F2 and the metal members 5, 6, 10, and 11 may be made of different metal materials in different processes.

The metal members 5, 6, 10, and 11 are not electrically connected to any of the functional electrodes F1 and F2. Thus, there is no electromagnetic field coupling relationship between the metal members 5, 6, 10, and 11 and the functional electrodes F1 and F2, and there is no electromagnetic field coupling relationship between the metal members 5, 6, 10, and 11 and wiring patterns (not illustrated). Accordingly, electrical characteristics of the elastic wave device 100 will not be adversely affected by such an electromagnetic field coupling relationship. The dielectric film 12 is provided on the main surface of the piezoelectric substrate 1 so as to cover the functional electrodes F1 and F2 and the metal members 5, 6, 10, and 11 together.

In the elastic wave device 100, since the metal members 5, 6, 10, and 11 are disposed in the second region R2, the difference between the manner in which the dielectric film 12 is formed on the first region R1 and the manner in which the dielectric film 12 is formed on the second region R2 is reduced. In other words, the irregularities on the outer surface of the dielectric film 12 are reduced. When performing grinding by the CMP method in the process of manufacturing the elastic wave device 100, the above-mentioned dishing does not occur in the dielectric film 12. Thus, in each of a large number of elastic wave devices 100 obtained by singulating an aggregate 100M, variations in irregularities on the outer surface of the dielectric film 12 are also reduced. As a result, the possibility of variations occurring in the electrical characteristics of the elastic wave device 100 is reduced.

Note that, as in an elastic wave device 100A illustrated in FIG. 2, which is a first modification of a preferred embodiment of the present invention, a plurality of substantially small-plate-shaped metal members 5 and 6 may preferably be disposed in the second region R2. In addition, as in an elastic wave device 100B illustrated in FIG. 3, which is a second modification of a preferred embodiment of the present invention, a plurality of belt-shaped or substantially belt-shaped metal members 5, 6, 10, and 11 may preferably be disposed in the second region R2.

Figure 4:
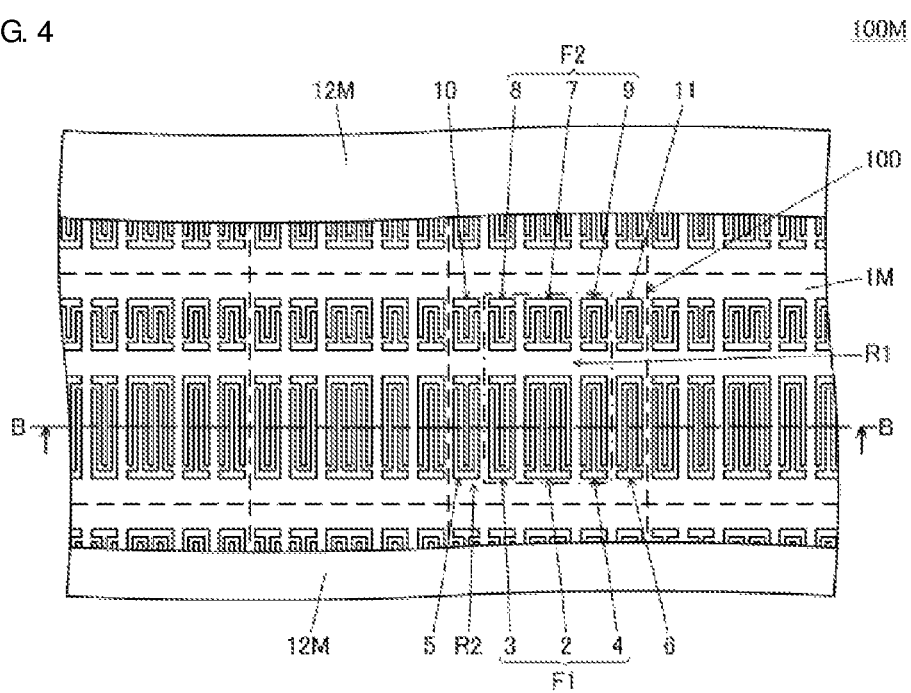
FIG. 4 is a plan view (top view) illustrating an aggregate that has not yet been singulated into elastic wave devices without illustrating a portion of a dielectric film that is in an aggregated state.

An exemplary method of manufacturing an elastic wave device 100 according to a preferred embodiment of the present invention will now be described with reference to FIG. 4 to FIG. 5D. FIG. 4 is a plan view (top view) illustrating the aggregate 100M from which a plurality of elastic wave devices 100 are obtained without illustrating a portion of a dielectric film 12M that is in an aggregated state. The elastic wave devices 100 are manufactured by singulating the aggregate 100M. The aggregate 100M is formed by using a wafer 1M of the piezoelectric substrate 1 as a base material, and a plurality of pairs of functional electrodes and metal members are formed on a main surface of the wafer 1M, after which the dielectric film 12M in the aggregated state is formed so as to cover the plurality of pairs of functional electrodes and metal members.

FIGS. 5A to 5D are sectional views schematically illustrating principal portions in processes that are sequentially performed in the exemplary method of manufacturing the elastic wave device 100. Note that each of FIGS. 5A to 5D is a sectional view taken along line B-B of FIG. 4. Consequently, the functional electrode F2 and the metal members 10 and 11 are not illustrated in FIGS. 5A to 5D.

Figure 5A:
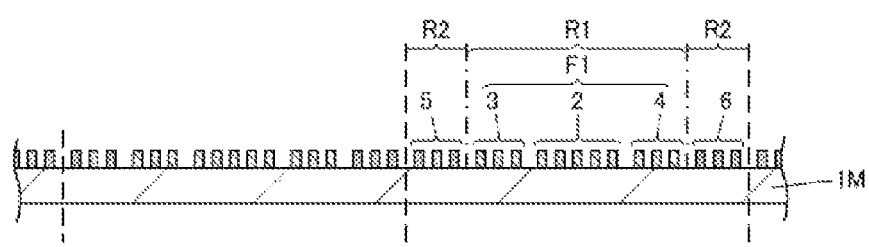
FIGS. 5A to 5D are sectional views each schematically illustrating an exemplary method of manufacturing the elastic wave device.

FIG. 5A is a schematic diagram illustrating a process of forming a plurality of pairs of the functional electrodes F1 and the metal members 5 and 6, each of the functional electrodes F1 including the comb-shaped or substantially comb-shaped electrode 2 and the reflectors 3 and 4, on the main surface of the wafer 1M of the piezoelectric substrate 1 that is used as a base material. As described above, each region of the main surface of the piezoelectric substrate 1 in which one of the functional electrodes F1 is formed will be referred to as the first region R1, and the remaining region of the main surface of the piezoelectric substrate 1 will be referred to as the second region R2. In other words, each of the metal members 5 and 6 is formed in the second region R2 of the main surface of the piezoelectric substrate 1 such that one of the functional electrodes F1 is interposed between a corresponding one of the metal members 5 and a corresponding one of the metal members 6 in the elastic wave propagation direction.

As described above, in each of the elastic wave devices 100, the functional electrode F1 and the metal members 5 and 6 are preferably made of the same metal material. Formation of the functional electrode F1 and the metal members 5 and 6 on the main surface of the wafer 1M is performed by a known technique, such as photolithography or a lift-off technique.

Figure 5B:
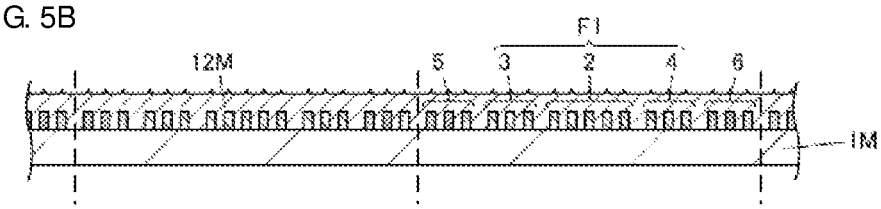

FIG. 5B is a schematic diagram illustrating a process of forming the dielectric film 12M in the aggregated state on the main surface of the wafer 1M on which the functional electrodes F1 and the metal members 5 and 6 have been formed. Formation of the dielectric film 12M in the aggregated state is performed by, for example, bias sputtering. In the case of forming the dielectric film 12M in the aggregated state by bias sputtering, substantially horn-shaped protrusions such as those illustrated in FIG. 5B remain on the outer surface of the dielectric film 12M in the aggregated state. The functional electrodes F1 and the metal members 5 and 6 are covered with the dielectric film 12M in the aggregated state through this process.

Figure 5C:
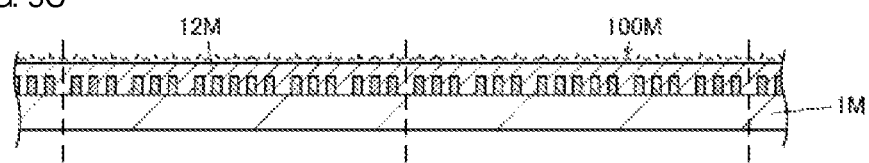

FIG. 5C illustrates a process of grinding the dielectric film 12M in the aggregated state. As described above, since protrusions remain on the outer surface of the dielectric film 12M in the aggregated state, which has been formed by bias sputtering, it is necessary to remove the protrusions and adjust the film thickness of the dielectric film 12M. Grinding of the dielectric film 12M in the aggregated state is performed by the CMP method. By performing the above processes, the aggregate 100M that has not yet been cut into the elastic wave devices 100 is obtained.

Figure 5D:
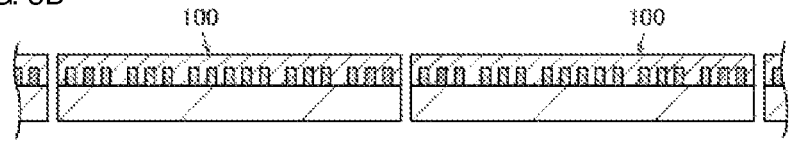
Figure 6A:
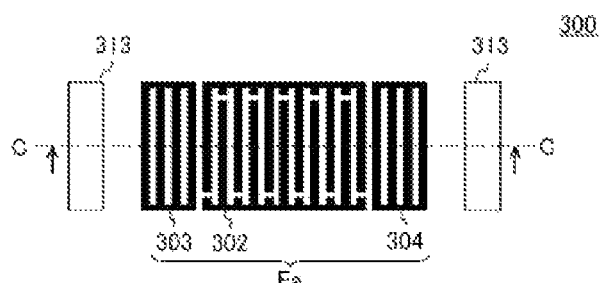
FIGS. 6A and 6B are respectively a plan view (top view) of an elastic wave device of the related art and a sectional view of the elastic wave device of the related art taken along line C-C of FIG. 6A.
Figure 6B:
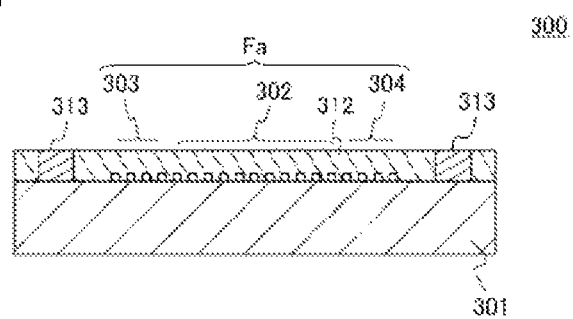

FIG. 5D illustrates a process of singulating the aggregate 100M so as to obtain the elastic wave devices 100. Singulating (cutting) of the aggregate 100M is performed by a known technique, such as cutting using a dicing saw. By performing the above processes, the elastic wave devices 100 are obtained. Note that the elastic wave device 100A, which is the first modification of a preferred embodiment of the present invention, and the elastic wave device 100B, which is the second modification of a preferred embodiment of the present invention, are able to be manufactured by a method similar to that described above.

Note that the present invention is not limited to the above-described preferred embodiments, and various applications and modifications can be made within the scope of the present invention. In addition, the preferred embodiments described in the present specification are examples, and it is to be noted that the configurations according to the different preferred embodiments may be partially replaced with one another or may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
    a piezoelectric substrate;
    a functional electrode that includes a comb-shaped or substantially comb-shaped electrode and a reflector, and that is provided on a main surface of the piezoelectric substrate;
    a dielectric film; and
    a metal member; wherein
    when a region of the main surface of the piezoelectric substrate in which the functional electrode is provided is referred to as a first region, and a region of the main surface of the piezoelectric substrate excluding the first region is referred to as a second region, the metal member is provided in the second region so as to be adjacent to the functional electrode and is not electrically connected to the functional electrode; and
    the dielectric film is provided on the main surface of the piezoelectric substrate so as to cover the functional electrode and the metal member together such that an upper surface of each of the functional electrode and the metal member is covered by the dielectric film.

2. The elastic wave device according to claim 1, wherein the metal member is made of a same metal material as the functional electrode.

3. The elastic wave device according to claim 2, wherein the metal member and the functional electrode are made of Cu or Al.

4. The elastic wave device according to claim 1, wherein the metal member has a comb shape or a substantially comb shape.

5. The elastic wave device according to claim 1, wherein the metal member and the functional electrode have a same or substantially a same thickness in a direction perpendicular or substantially perpendicular to the main surface of the piezoelectric substrate.

6. The elastic wave device according to claim 1, wherein the metal member has a small-plate shape.

7. The elastic wave device according to claim 1, wherein the metal member has a belt shape or a substantially belt shape.

8. The elastic wave device according to claim 1, wherein the comb-shaped or substantially comb-shaped electrode is an interdigital transducer electrode.

9. The elastic wave device according to claim 1, wherein the reflector includes reflectors disposed on opposite ends of the comb-shaped or substantially comb-shaped electrode.

* * * * *